United States Patent
Smith et al.

[11] Patent Number: 5,988,266
[45] Date of Patent: Nov. 23, 1999

[54] BONDED CAST, PIN-FINNED HEAT SINK AND METHOD OF MANUFACTURE

[75] Inventors: Dean L. Smith, Pittsford; Edmund J. Sobresky, Batavia; Roger S. Kerr, Brockport, all of N.Y.

[73] Assignee: Eastman Kodak Company, Rochester, N.Y.

[21] Appl. No.: 09/129,245

[22] Filed: Aug. 5, 1998

Related U.S. Application Data

[62] Division of application No. 08/959,692, Oct. 29, 1997, Pat. No. 5,829,514.

[51] Int. Cl.$^6$ ........................................................ F28F 7/00
[52] U.S. Cl. ........................... 165/78; 165/80.3; 165/185; 174/16.3; 257/722; 361/704
[58] Field of Search ..................... 165/80.3, 185, 165/78, 170; 174/16.3; 257/722; 361/704

[56] References Cited

U.S. PATENT DOCUMENTS

| | | | |
|---|---|---|---|
| 3,387,653 | 6/1968 | Coe ........................ | 165/170 X |
| 3,524,497 | 8/1970 | Chu et al. ................. | 165/185 X |
| 4,638,858 | 1/1987 | Chu ........................ | 165/185 |
| 4,733,453 | 3/1988 | Jacoby .................... | 165/80.3 X |
| 4,762,173 | 8/1988 | Blakely et al. ............. | 16/170 |
| 4,777,560 | 10/1988 | Herrell et al. . | |
| 4,884,331 | 12/1989 | Hinshaw . | |
| 5,172,301 | 12/1992 | Schneider ................. | 165/185 X |
| 5,304,846 | 4/1994 | Azar et al. . | |
| 5,351,748 | 10/1994 | Dagan ..................... | 165/80.3 |
| 5,504,650 | 4/1996 | Katsui et al. .............. | 165/80.3 X |
| 5,655,600 | 8/1997 | Dewar et al. ............. | 165/185 X |

FOREIGN PATENT DOCUMENTS 199736  7/1992  Japan ..................................... 165/185

OTHER PUBLICATIONS catalogue material—Augmented Surface Bonded Heat Sinks published by AAVID™ Thermal Technologies, Inc. (Mar. 1996).

*Primary Examiner*—Leonard Leo
*Attorney, Agent, or Firm*—Clyde E. Bailey, Sr.

[57] ABSTRACT

A high performance, high pin fin density heat sink (10) has mating first and second opposing base members (22, 24) having first and second pin fins (18, 20) extending generally perpendicularly therefrom. The pin fins (18, 20) are generally cylindrical and each bonded into recesses (30,32) formed on the opposing base member (22, 24). The spaces between nearest adjacent first and second pin fins (18, 20) form narrow fluid passageways (12) having a gas inlet in (14) for communicating with a heat generating body and gas out let end (16).

6 Claims, 6 Drawing Sheets

BONDED CAST, PIN-FINNED HEAT SINK AND METHOD OF MANUFACTURE

This Appln is a Div of Ser. No. 08/959,692 Oct. 29, 1997, now U.S. Pat. No. 5,829,514.

FIELD OF THE INVENTION

The invention relates to heat sinks, more particularly, the invention concerns bonded, pin-finned heat sinks having high fin density enabling exceptional thermal performance, and the method of making same.

BACKGROUND OF THE INVENTION

Existing high performance heat sinks are characterized by a high fin density design, i.e., a fin population about twice that which can be normally produced in a standard production process. In this case, the surface area has a major influence on the overall heat transfer capability of the heat sink. Additionally for existing heat sinks having tightly spaced fins, the heat transfer coefficient is determined by the hydraulic diameter of the heat sink design. Hydraulic diameter is generally defined in the art as four times the area of the channel (i.e., space or distance between adjacent fins) divided by the perimeter of the channel. Thus, the smaller the hydraulic diameter, the higher both the heat transfer coefficient and the heat transfer of the heat sink.

One such design is illustrated in U.S. Pat. No. 4,777,560 by Herrell et al in which a high performance, high fin density heat sink is described. According to Herrell et al., various alternative heat sink construction techniques are described that produce high fin density design. An inherent disadvantage of the design is the inability to maximize the surface area of each individual fin. Approximately 25% to 33% of the potential individual fin surface area is not available, as this area is in contact with the adjacent fin (See for instance Herrell et al, FIGS. 1, 2, 3 and 4). In addition, heat sinks based on FIGS. 1 and 2 in Herrell et al have an internal plenum that further decreases available surface area for a given volume of a heat sink design. Thus, Herrell et al do not teach maximizing heat sink surface area, for a given heat sink volume.

In U.S. Pat. No. 5,304,846 to Azar et al, a heat sink design is disclosed that maximizes fin surface area in a high performance, high fin density heat sink. According to Azar et al., the manufacturing techniques disclosed are crystal-orientation-dependent etching, precision sawing, electric discharge machining, or numerically controlled machining. A major shortcoming of the Azar et. al. heat sink design is that they are generally difficult to manufacture. Additionally, the Azar et. al. heat sink requires enormously high production cycle time to manufacture which, of course, makes them cost ineffective.

In U.S. Pat. No. 4,884,331 by Hinshaw, a method of manufacturing a pin-finned heat sink from an extrusion is described. According to the cross cut machine method disclosed in Hinshaw, the maximum pin fin density that can be achieved is limited to what is obtainable by an extrusion process. This latter limitation clearly would not be acceptable in the heat sink design of the present invention. Another shortcoming of Hinshaw is that only square or rectangular pin fins can be manufactured, no round or elliptical profiles are available.

Moreover, various heat sink manufacturers exist that offer bonded fin heat sink assemblies in which each fin in the assembly is individually bonded into a heat sink base. (See for instance, catalogue material on Augmented surface Bonded Heat Sinks published by AAVID™ Thermal Technologies, Inc. (March 1996). A major shortcoming, however of the AAVID™ heat sinks is their enormously high cost. This cost is related directly to the labor required to individually arrange each fin on some sort of support or substrate and high production cycle time.

Therefore, a need persists for a high performance, high fin density heat sink that maximizes heat sink surface area and is cost effective and simple to manufacture.

SUMMARY OF THE INVENTION

It is, therefore, an object of the invention is to provide a dual cast pin finned bonded heat sink that has a high pin fin density and a plurality of fluid flow channels defined by open spaces between nearest adjacent pin fins of bonded heat sink members.

Yet another objective of the invention is to provide a method of making a high pin finned density, high performance cast heat sink.

Still another object of the invention is to provide a method of manufacturing a high performance, high pin finned density cast heat sink that is cost effective.

Yet another object of the invention is to provide a plurality of integral ducts or fluid channels for the heat sink that insures that all air flow goes through the heat sink with no air by-pass.

Still another object of the invention is to provide a heat sink that permits a unidirectional air stream flow through the gas passageways.

Yet another object of the invention is to provide a heat sink in which the fin geometry is not limited by the method of manufacture.

It is a feature of the heat sink of the present invention that a plurality of cast vertically extending pin fins in opposing base members have an end portion arranged and bonded into recesses formed in common faces of the opposed base members.

To overcome one of more problems in the prior art, there is provided, in one aspect of the invention, a heat sink that has a cast first base member having a plurality of spaced, substantially parallel first pin fins extending substantially perpendicular from a common first face of the first base member. A cast second base member having a plurality of spaced, substantially parallel second pin fins extending substantially perpendicular from a common second face of the second base member opposes the first base member. The plurality of second pin fins of the common second face are configured to bond with the common first face of the first base member; and, the plurality of first pin fins of the first base member are configured to bond with the common second face of the second opposing base member. Also provided in the common first and second face of the base members are first and second means for receiving each one of the plurality of spaced first and second pin fins, respectively.

Moreover, means is provided for fixing, by preferably bonding, each one of the plurality of first and second pin fins against movement in a corresponding one of the first and second means for receiving, respectively. In the assembled heat sink of the invention, nearest adjacent first and second pin fins bonded in a respective opposing common face form a plurality of narrow gas passageways therebetween.

In another aspect of the invention, a heat sink has a cast first base member having a plurality of spaced, substantially parallel, first and second pin fins each extending substantially perpendicular from a common first face and wherein the first pin fins are somewhat longer than the second pin fins. Further, a cast base support member has a plurality of spaced, substantially parallel, third and fourth pin fins extending from a common second face, and wherein the third pin fins are somewhat longer than the fourth pin fins. A first means is provided in the common first face for receiving the spaced third pin fins. Also, second means is provided in the common second face for receiving the spaced first pin fins. Further provided are means for fixing, by preferably bonding, the spaced first and third pin fins against movement in their respective means for receiving, similar to the above described embodiment.

In yet another aspect of the invention, a method of making a thermally efficient heat sink includes the steps of (a) providing a mold for casting first and second base members, and then (b) casting the first and second base members in accordance with the description above. The cast base members are then aligned and assembled to form the heat sink described in the above embodiments of the invention.

It is, therefore, an advantageous effect of the invention that a high performance, high fin density pin finned cast heat sink is cost effective to manufacture, simply constructed, and has a wide variety of uses.

BRIEF DESCRIPTION OF THE DRAWINGS

The foregoing as well as other objects, features and advantages of this invention will become more apparent from the appended Figures, wherein like reference numerals denote like elements, and wherein.

DETAILED DESCRIPTION OF THE INVENTION

Figure 1B:
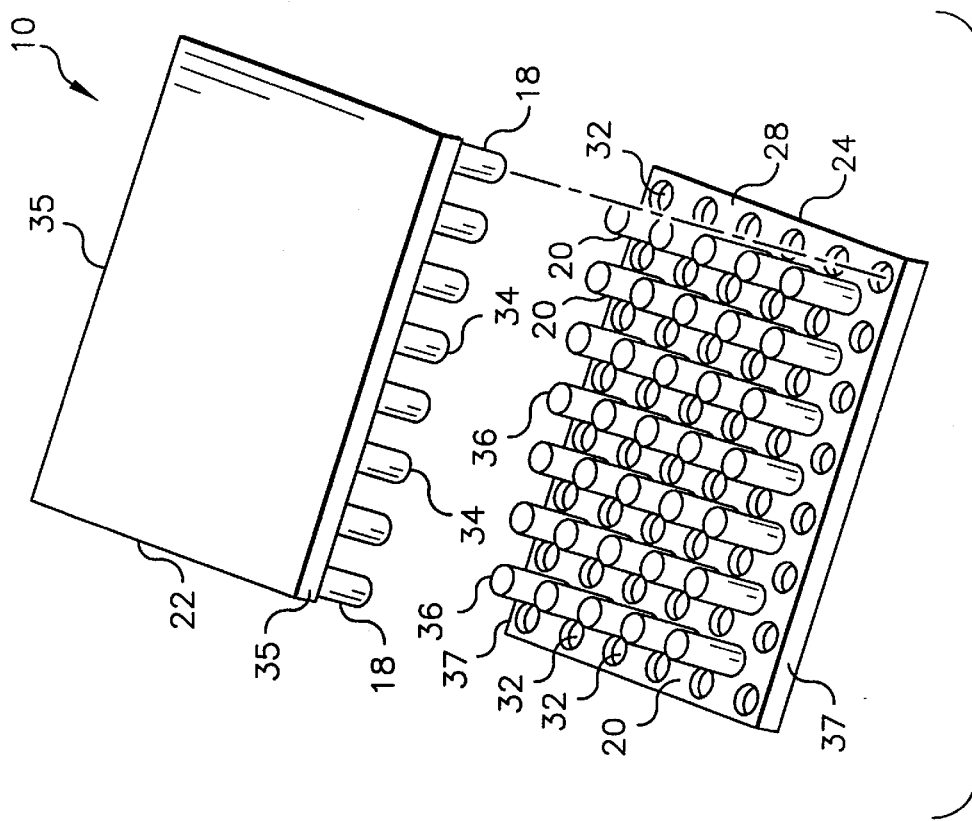
FIGS. 1(a) and 1(b) show exploded perspective views of the heat sink of the invention showing pin fins in first and second base members aligned for bonding.
Figure 1A:
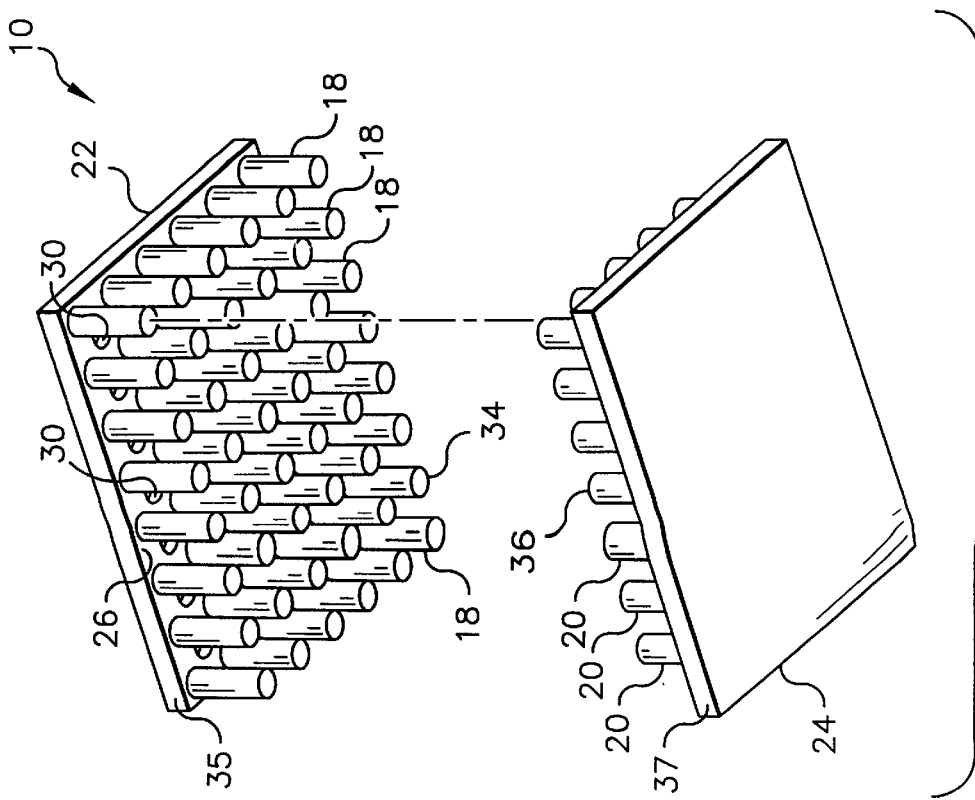

Turning now to the drawings, and more particular to FIGS. 1(a)–6 there is illustrated the heat sink 10 in accordance with the principles of the invention. Broadly defined, heat sink 10 comprises a plurality of closely spaced narrow gas passageways 12 having a gas inlet end 14 adaptable for receiving heat from a heat generating body (not shown) and a gas outlet end 16 upstream of the gas inlet end 14. Narrow gas passageways 12 are formed by spaced apart first and second pin fins 18, 20 each being fixed in a respective cast base member (described below). Thus gas, such as heat, generated by a heat generating body (not shown) will pass through gas inlet end 14 and then flow unidirectionally through a path defined by numerous spaced gas passageways 12 (formed by spaces between nearest adjacent first and second pin fins 18, 20, refer to FIG. 7) before it exits through the gas outlet end 16 of the heat sink 10.

According to FIGS. 1(a)–3, first and second fins 18, 20 are arranged (as described below) for bonding, respectively, to second and first opposing base members 22, 24. More specifically, first base member 22 has a plurality of spaced, substantially parallel first fins 18 extending substantially perpendicular from a common first face 26. Likewise, opposing second base member 24 has a plurality of spaced, substantially parallel second fins 20 extending substantially perpendicular from a common second face 28. Each of the plurality of fins 18, 20 is spatially separated from a nearest adjacent fin by recess 30, 32 (described below) formed, respectively, in common first and second faces 26,28. Recesses 30, 32 in base members 22, 24 are generally similarly configured, although they may have different configurations, such as depths and diameters.

Base members 22, 24 and pin fins 18, 20 are preferably cast from a variety of commercially available thermally conductive nonferrous materials, for instance, zinc alloys, copper, copper alloys, magnesium, aluminum and a mixture thereof. In our preferred embodiment we used copper alloys which has the advantage of high thermal conductivity. Skilled artisans will, however, appreciate that other means of forming pin fins 18, 20 may be utilized, for instance, an impact extrusion process.

Figure 2B:
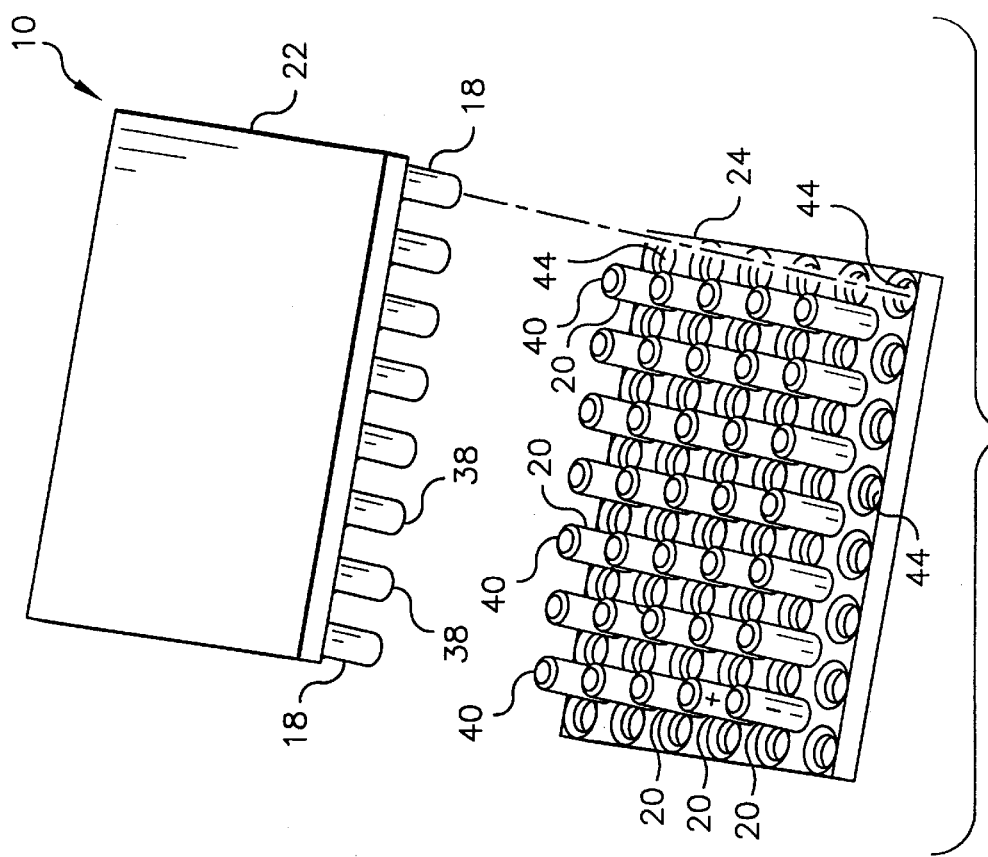
FIGS. 2(a) and 2(b) show exploded perspective views of an alternative embodiment of the invention with first and second base members having chamfered pin fins and recesses aligned for bonding.
Figure 2A:
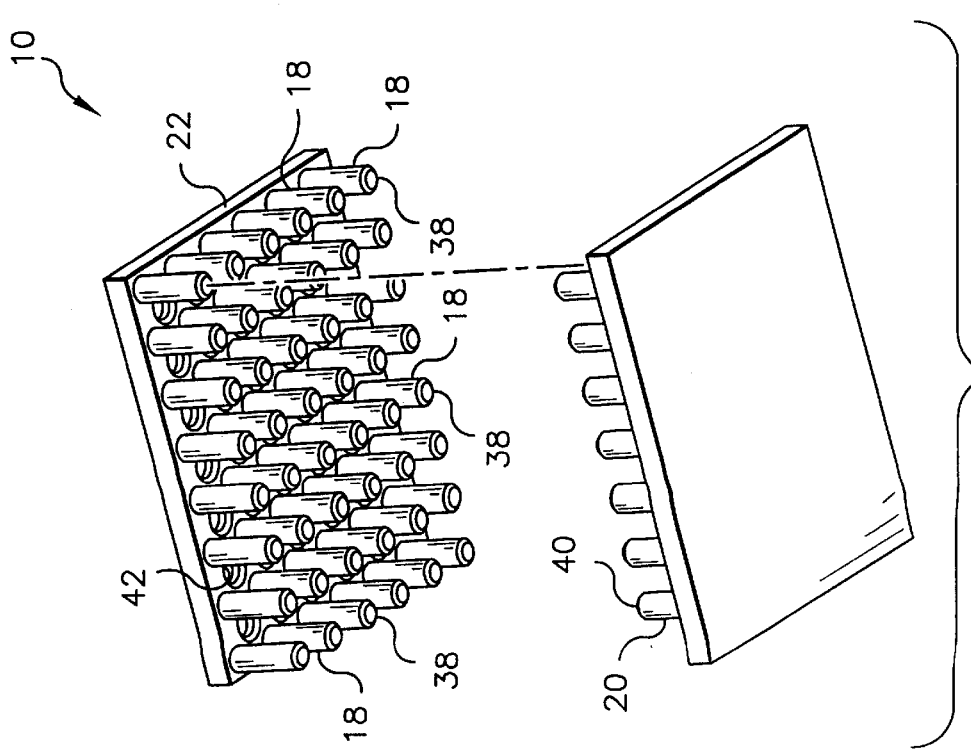
Figure 6:
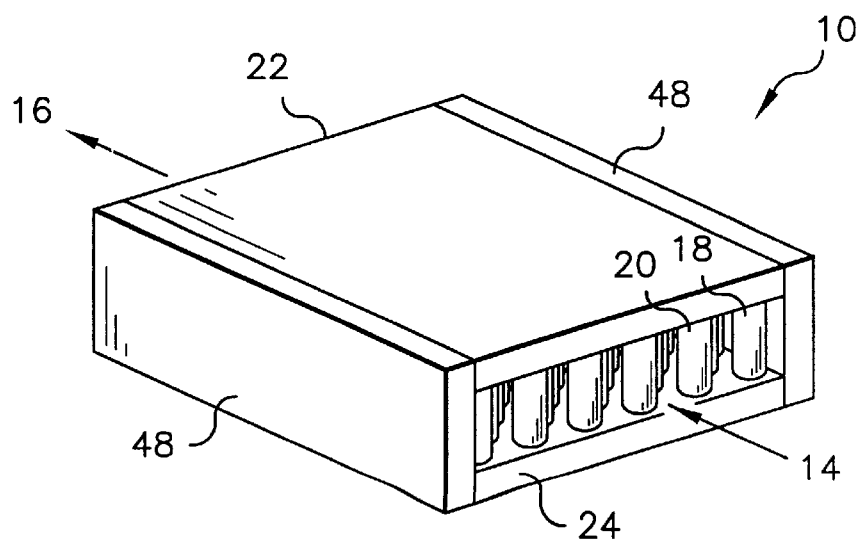
FIG. 6 is a perspective view of the assembled heat sink having side fluid flow shields; and, FIG. 7 is a plan view, partially torn away, illustrating the gap between adjacent pin fins in the heat sink.
Figure 7:
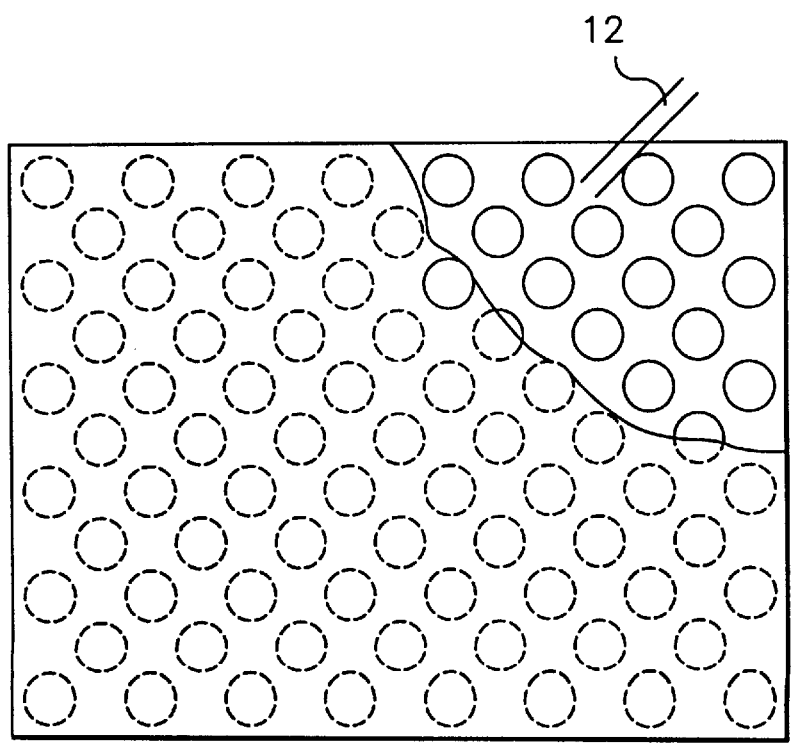

Referring again to FIGS. 1–3, in the preferred embodiment, pin fins 18, 20, have the same dimensions (height and diameter) and geometry for simplicity of manufacture and use, as described in detail below. We prefer generally cylindrical shaped fins 18, 20, alternately referred to as pin fins, which when assembled in the manner described below form a plurality of closed spaced gas passageways 12. Referring to FIG. 6, heat sink 10 may have a pair of fluid flow shields 48 affixed to opposing lateral end edges 35, 37 (illustrated in FIG. 1A) of first and second base members 22, 24 of the heat sink 10. Fluid flow shields 48 serve to contain and direct the gas flow from the gas inlet 14 to the gas outlet end 16 of the heat sink 10. In an alternative embodiment, pin fins 18, 20 may each have a chamfered top end edge 38, 40 and the common first and second faces 26, 28 may have chamfered recesses 42, 44. As seen in FIGS. 2(a) and 2(b), chamfering both the top end edges 34, 36 and the associated recesses 30, 32 facilitates guiding the pin fins 18, 20 easily into a recess 42, 44 in an opposing base member 22, 24, as described further below.

Figure 3A:
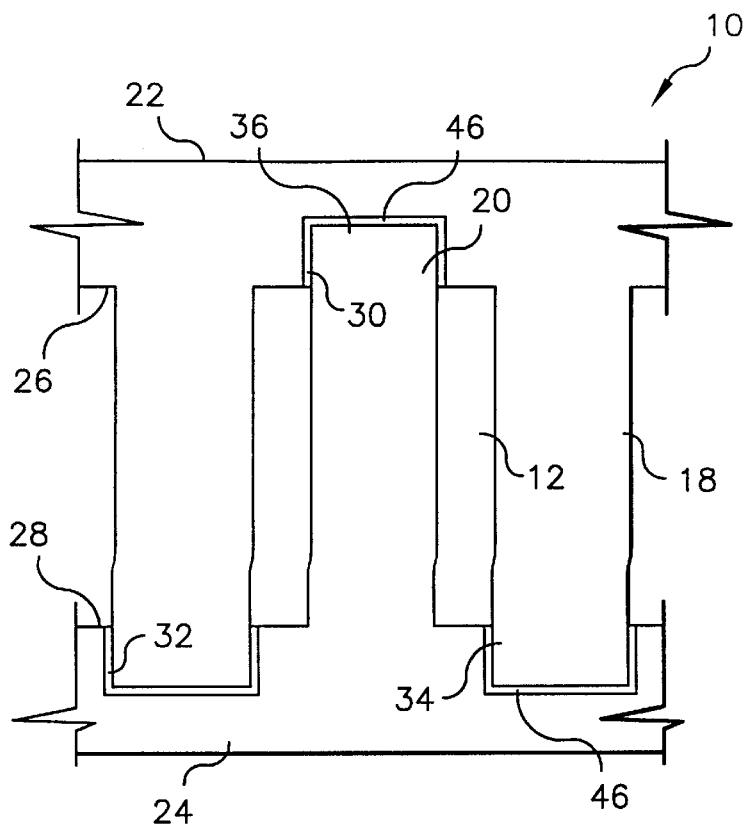
FIGS. 3(a) and 3(b) show enlarged fragmentary views of fins bonded in the cast first and second base members of the invention.
Figure 3B:
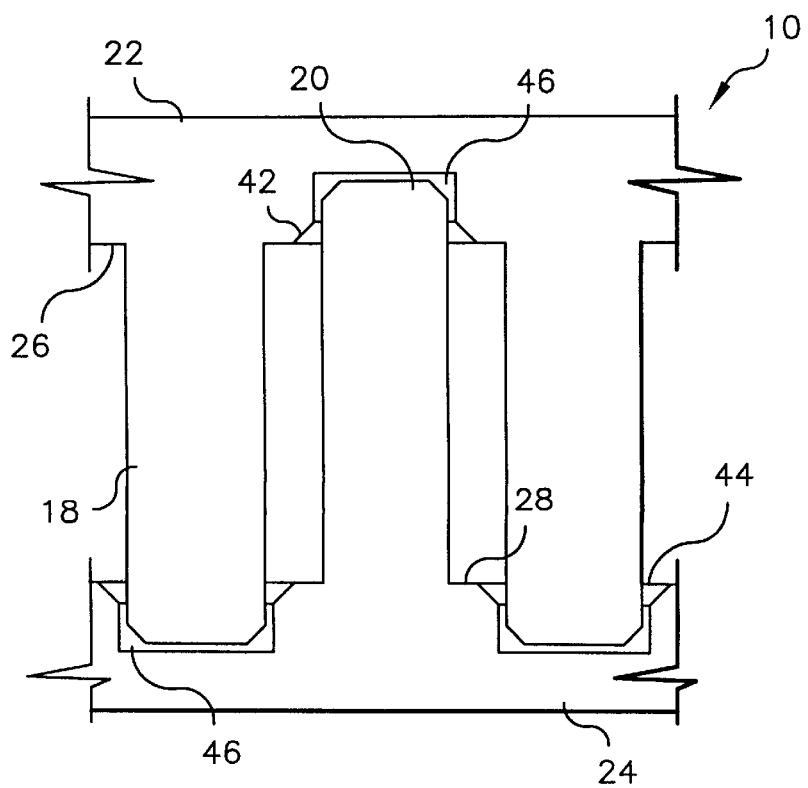
Figure 4:
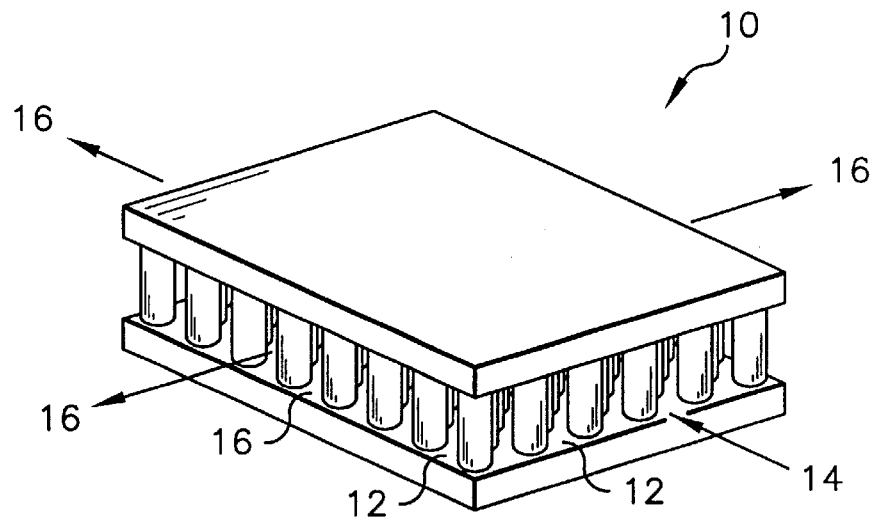
FIG. 4 is a perspective view of the assembled heat sink of the invention showing plurality of gas flow passageways.

As depicted in FIGS. 3(a) and 3(b), it is important to the invention that the plurality of second fins 20 extending from the common second face 28 of second base member 24 be arranged for bonding to common first face 26 of first base member 22. Similarly, the plurality of first fins 18 extending from the first base member 22 is arranged for bonding to common second face 28 of the second opposing base member 24. In this way, nearest alternate adjacent pin fins 18, 20 in the assembled heat sink 10 are orderly arranged to form a plurality of gas passageways 12 passing through the heat sink 10 from the gas inlet end 14 to the gas outlet end 16.

Referring again to FIGS. 3(a) and 3(b), the depth of the recesses 30, 32 is not important although we prefer that each recess 30, 32 be slightly larger than the diameter of the pin fins 18, 20 for securing the pin fins 18, 20 against movement. In general, however, the depth of the recesses 30, 32 is determined by the specific application of the heat sink. Further, the top end edge 34, 36 of each of the fins 18, 20 is bonded into a respective recess 30, 32 to secure the pin fins 18, 20 against movement. We prefer using a bonding layer 46, for instance, an epoxy resin, although other bonding materials may be used such as vacuum brazing or soldering.

Compared to cast pin finned heat sinks in the prior art, our invention has double the pin finned density. Skilled artisans will appreciate that pin finned density in existing heat sinks have large spacing between the centerlines of adjacent pin fins. It is well known that this spacing limitation is determined by the casting process. In contradistinction, our heat sink 10 has about twice the number of pin fins 18, 20 with approximately equal numbers being in each mating fin base members 22, 24. When the two base members 22,24 are bonded together, as discussed above, the surface area available for heat transfer is approximately doubled since the number of pin fins 18, 20 is approximately doubled. This reduces the resistance of the heat flow to about one-half of the pin fins 18, 20 thereby making the heat sink more efficient. In addition, only ½ of the pin fins 18, 20 have a bonded joint at the opposing heat sink base member 22, 24 thus leading to improved heat transfer as well as increased structural performance.

An exemplary heat sink 10 of the invention formed using a die cast process includes a first base member 22 made from an aluminum alloy having a first pin fin 18 diameter of about 0.08 inches (0.203 cm) and a height of about 0.200 inches (0.51 cm). Centerline spacing, i.e., distance between nearest adjacent first pin fins 18, is 0.220 inches (0.56 cm). Based on these dimensions of the first base member 22, the actual gap between first pin fins 18 is about 0.150 inches (0.38 cm). Second base member 24 also cast from aluminum alloy has a plurality of second fins 20 having the same diameter and height as the first fins 18. When the pin fins 18, 20 are bonded into recesses 30, 32 of respective opposing base members 22, 24, the pin fins 18, 20 are orderly arranged and spaced from one another by about 0.076 inches (0.19 cm) defining the gas passageways 12 of the heat sink 10. Thus, in contrast to conventional pin-finned heat sinks, there are approximately twice the number of pin fins 18, 20 in the present invention occupying substantially the same volume of space.

Another exemplary heat sink 10 of the invention formed using an investment casting process includes a first base member 22 cast from aluminum alloy wherein the first pin fins 18 diameter is 0.070 inches (0.18 cm) and height is 0.600 inches (1.5 cm). In this case, the centerline between nearest adjacent first pin fins 18 is 0.130 inches. Thus, the actual gap width between first pin fins 18 is 0.060 inches (0.15 cm). Similarly, cast second base member 24 has second pin fins 20 having the same dimensions as the first pin fins 18. When the first and second base members 22, 24 are bonded together as described above, heat sink 10 formed thereby has a plurality of very narrow gas passageways 12, i.e., spacing between nearest adjacent first and second pin fins 18, 20, having a width of 0.022 inches (0.06 cm) with approximately twice the number of pin fins 18, 20 compared to a conventional pin finned heat sink.

In another embodiment of the invention, a method of making a thermally efficient heat sink 10 (represented in FIGS. 1–6) includes the steps of providing a mold (not shown) for casting first and second base members 22, 24, as described above; and, then casting the first and second base members 22, 24. According to this embodiment, first and second base members 22, 24 each has a plurality of spaced first and second fins 18, 20 and similarly configured and arranged in recesses 30, 32 formed in respective common first and second faces 26, 28 of the respective base member 22, 24.

After the first and second base members 22, 24 are cast, they are then removed from mold and prepared for assembling in accordance with the invention. The common first face 26 of the first base member 22 is aligned with the common second face 28 of the second base member 24 such that the first fins 18 are arranged for being received by the recess 32; and, the second fins 20 are arranged for being received by the recess 30. A bonding layer 46, such as an epoxy resin, is applied to either of the recesses 30, 32 and the first and second fins 18, 20. The first and second pin fins 18, 20 are then inserted into the respective recesses 30, 32 in a predetermined fashion in which nearest adjacent first and second pin fins 18, 20 form a plurality of gas passageways 12 through which fluid, such as air, heated by a heat generating body can pass unidirectionally from an inlet end to the outlet end of the heat sink 10, as described above.

Figure 5A:
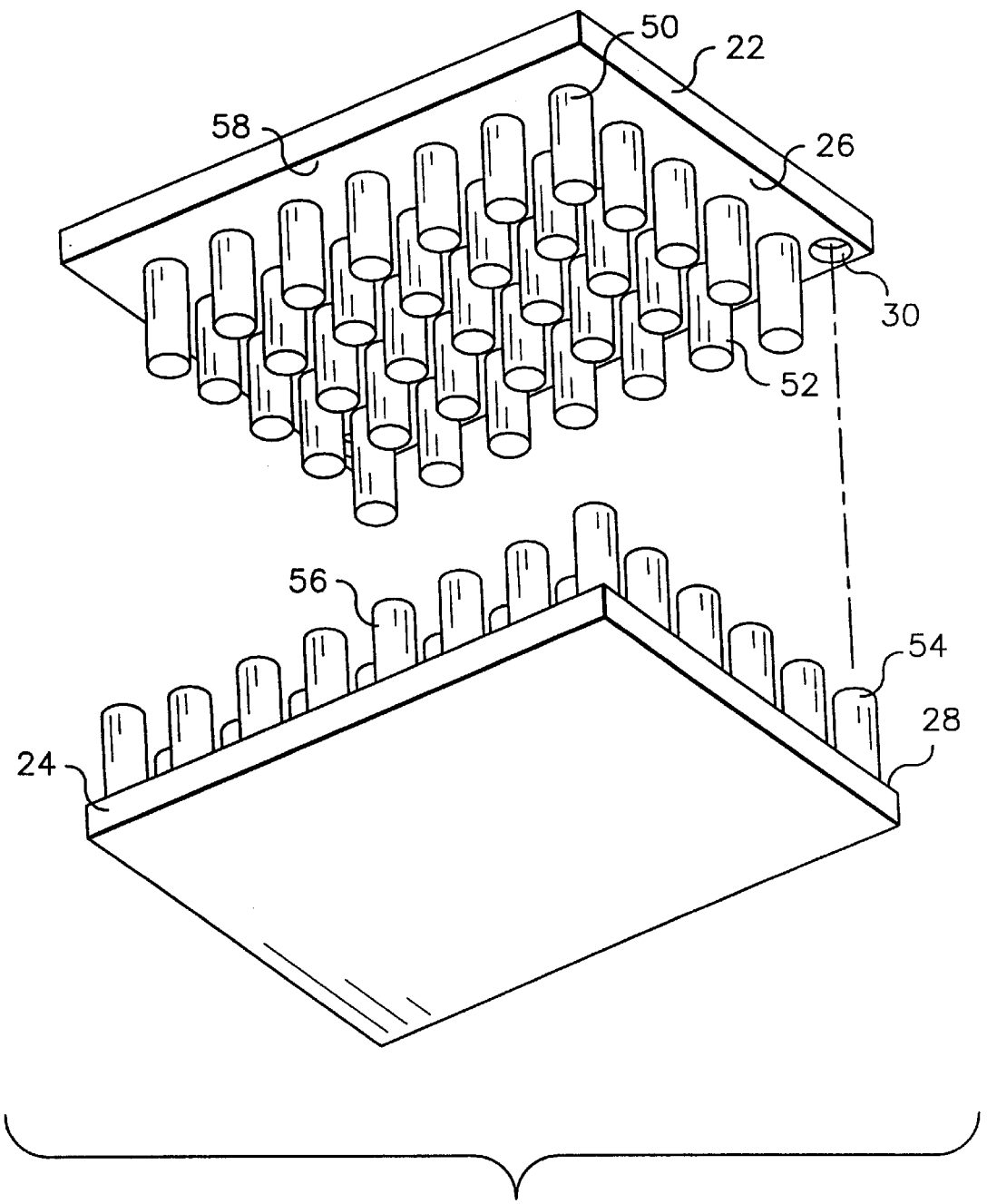
FIGS. 5(a) and 5(b) show exploded perspective views of an alternative embodiment of the invention.
Figure 5B:
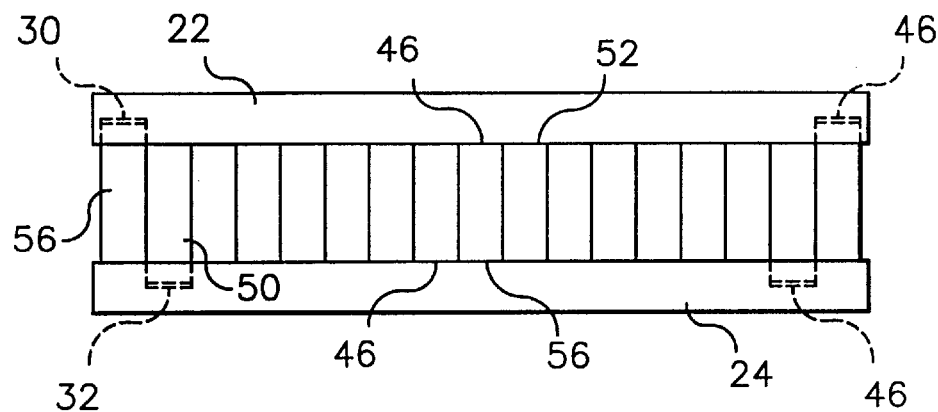

According to FIGS. 5(a) and 5(b), in another embodiment of the invention, heat sink 10 may comprise opposing first and second base members 22, 24, as described above. In this embodiment, however, first base member 22 has a plurality of spaced, substantially parallel, first and second fins 50, 52 each extending substantially perpendicular from a common first face 26, but with the first fins 50 being somewhat longer than second fins 52. Likewise, the second base member 24 has a plurality of spaced, substantially parallel, third and fourth fins 54, 56 extending from a common second face 28 with the third fins 54 being somewhat longer than the fourth fins 56.

Illustrated in FIG. 5, first means, preferably a plurality of recesses 30, is provided in the common first face 26 for receiving at least two of the plurality of spaced third pin fins 54. Each of the fourth pin fins 56 not secured in a recess 30 are arranged for abutting contact with the common first face 26 of the opposing base member 22. Similarly, second means, preferably a plurality of recesses 32, is provided in the common second face 28 for receiving at least two of the plurality of spaced first pin fins 50. Second fins 52 not secured in a recess 32, i.e., the shorter fins, are configured for making abutting contact with the common face 28 of the opposing base member 22.

PARTS LIST

10 . . . assembled heat sink
12 . . . gas passageway
14 . . . gas inlet end of heat sink 10
16 . . . gas outlet end of heat sink 10
18 . . . first pin fins
20 . . . second pin fins
22 . . . first base member
24 . . . second base member
26 . . . common first face of member 22
28 . . . common second face of member 24
30 . . . first recesses in member 22
32 . . . second recesses in member 24
34 . . . top edge of first pin fins
35 . . . lateral end edge of first base member 22
36 . . . top edge of second pin fins
37 . . . lateral end edge of second base member 24
38 . . . chamfered end of first pin fins
40 . . . chamfered end of second pin fins
42 . . . chamfered recesses in member 22
44 . . . chamfered recesses in member 24
46 . . . bonding layer
48 . . . fluid flow shields
50 . . . first pin fins in alternative embodiment
52 . . . second pin fins in alternative embodiment
54 . . . third pin fins in alternative embodiment
56 . . . fourth pin fins in alternative embodiment While the invention has been described with a certain degree of particularity, it is manifest that many changes may be made in the details of construction and the arrangement of components without departing from the spirit and scope of this disclosure. It is understood that the invention is not limited to the embodiment set forth herein for purposes of exemplification, but is to be limited only by the scope of the attached claims, including the full range of equivalency to which each element thereof is entitled.

What is claimed is:

1. A heat sink, comprising:

a first base member having a plurality of spaced, substantially parallel first pin fins, each of said first pin fins having a first lead end extending substantially perpendicular from a common first face of said first base member;

a second opposing base member having a plurality of spaced, substantially parallel second pin fins, each of said second fins having a second lead end extending substantially perpendicular from a common second face of said second base member, wherein said plurality of second pin fins of said common second face are configured to mate with said common first face of said first base member, and wherein said plurality of first pin fins of said first base member are configured to mate with said common second face of said second opposing base member;

a plurality of first recesses formed in said common first face, each one of said plurality of first recesses being provided for receiving one of said second lead end associated with a corresponding one of said plurality of spaced second pin fins, each one of said plurality of first recesses having a first bottom wall and first sidewalls surrounding said bottom wall;

a plurality of second recesses formed in said common second face, each one of said plurality of second recesses being provided for receiving one of said first lead end associated with a corresponding one of said plurality of spaced first pin fins in a spaced relations with said first fins, each one of said second recesses having a second bottom wall and second sidewalls surrounding said second bottom wall; and, means for fixing at least a portion of said plurality of first pin fins against movement in a corresponding one of said plurality of second recesses such that said first lead end associated with a corresponding one of said plurality of first pin fins abuts against the second bottom wall of one of said second plurality of recesses, wherein remaining ones of said plurality of first pin fins abut against said first common face of said second opposing base member; and means for fixing at least a portion of said plurality of second pin fins against movement in a corresponding one of said plurality of first recesses such that said second lead end associated with a corresponding one of said plurality of second pin fins abuts against the first bottom wall of one of said first plurality of recesses, wherein remaining ones of said plurality of second pin fins abut against said common face of said first opposing base member; and wherein each one of said plurality of first pin fins nearest adjacent to any one of said plurality of second pin fins forms a narrow fluid passageway therebetween.

2. The heat sink recited in claim 1 wherein said first lead end of said plurality of first pin fins is bonded to a respective second bottom wall of one of said plurality of second recesses with an epoxy resin; and wherein said second lead end of said plurality of second pin fins is bonded to a respective first bottom wall of one of said first plurality of recesses with said epoxy resin.

3. The heat sink recited in claim 1, wherein each of said plurality of first and second pin fins has a generally cylindrical shape.

4. The heat sink recited in claim 1, wherein said first and second base members are made from a nonferrous material.

5. The heat sink recited in claim 1, wherein said first and second base members comprise materials selected from the group consisting of:

(a) aluminum alloys;

(b) zinc alloys;

(c) magnesium alloys;

(d) copper alloys; and, (e) mixtures thereof.

6. The heat sink recited in claim 1, wherein each one of said plurality of first and second recesses and each one of said plurality of first and second pin fins include a chamfered end edge for guiding each one of said first and second lead ends into one of said plurality of first and second recesses, respectively.

* * * * *